(12) United States Patent
Huang et al.

(10) Patent No.: US 7,169,661 B2
(45) Date of Patent: Jan. 30, 2007

(54) PROCESS OF FABRICATING HIGH RESISTANCE CMOS RESISTOR

(75) Inventors: Chih-Feng Huang, Jhubei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/823,238

(22) Filed: Apr. 12, 2004

(65) Prior Publication Data

US 2005/0227430 A1    Oct. 13, 2005

(51) Int. Cl.
*H01L 21/8238* (2006.01)

(52) U.S. Cl. .................... 438/210; 438/238; 438/329; 438/330; 438/382; 257/350; 257/358; 257/363; 257/E27.016

(58) Field of Classification Search ............... 438/225, 438/210, 238, 382, 329, 330, 381; 257/350, 257/358, 363, 516, 543, E27.037, E27.016, 257/E27.024, E27.031
See application file for complete search history.

(56) References Cited

U.S. PATENT DOCUMENTS

| | | | | |
|---|---|---|---|---|
| 5,302,549 A | * | 4/1994 | Santangelo et al. | 438/530 |
| 5,545,584 A | * | 8/1996 | Wuu et al. | 438/152 |
| 5,825,074 A | * | 10/1998 | Rolfson et al. | 257/536 |
| 5,883,566 A | * | 3/1999 | Nowak et al. | 338/311 |
| 6,054,359 A | * | 4/2000 | Tsui et al. | 438/385 |
| 6,124,179 A | * | 9/2000 | Adamic, Jr. | 438/309 |
| 6,300,668 B2 | * | 10/2001 | Miller et al. | 257/536 |
| 6,340,834 B1 | * | 1/2002 | Rolfson et al. | 257/538 |
| 6,340,835 B1 | * | 1/2002 | Rolfson et al. | 257/538 |
| 6,951,384 B2 | * | 10/2005 | Anderson et al. | 347/58 |
| 6,992,346 B2 | * | 1/2006 | Kim et al. | 257/303 |

* cited by examiner

*Primary Examiner*—Thao P. Le
(74) *Attorney, Agent, or Firm*—J.C. Patents

(57) ABSTRACT

A process of forming a high resistance CMOS resistor with a relatively small die size is provided. According to an aspect of the present invention, the process of fabricating a high resistance resistor is a standard CMOS process that does not require any additional masking. An n-well is firstly formed in a p-type silicon substrate. A nitride film is then deposited and patterned to form a patterned mask layer. The patterned mask layer serves as a mask. A p-field region is formed in the n-well to form a CMOS resistor. The CMOS resistor according to the present invention has a resistance of 10 kΩ–20 kΩ per square.

22 Claims, 8 Drawing Sheets

PROCESS OF FABRICATING HIGH RESISTANCE CMOS RESISTOR

BACKGROUND OF THE INVENTION

1. Field of the Invention

The present invention relates to a semiconductor manufacturing process, and more specifically to a process of fabricating a high resistance CMOS resistor.

2. Description of Related Art

Many common circuits manufactured using CMOS process require resistor elements. In the area of analog circuits, resistor elements having high-resistance values (100 kΩ–500 kΩ) are sometimes desired. The demand for such resistors is especially common in the field of power-relative analog circuits.

In one common application, many power-relative analog circuits include voltage dividers constructed from a pair of CMOS resistors. Such voltage dividers provide reference voltages that are stepped down from a supply voltage. The higher the resistance of the resistors is, the less standby power will be consumed.

Currently, most widely used CMOS resistors are either junction resistors or film resistors. Common junction resistor types include NW resistors, PW resistors, NDIFF(N+S/D) resistors, and PDIFF(N+S/D) resistors. Common film resistor types include Poly resistors, M1 resistors, and M2 resistors.

Though these resistors have satisfactory resistor characteristics, their resistance is generally limited to 1 kΩ–5 kΩ per square. When a high-resistance element is required, it can be created either by using extra die space, or by performing additional masking steps during the manufacturing process. However, neither of these alternatives is desirable because they both increase the cost of manufacturing the circuit.

Creating a high-resistance resistor (100 kΩ–500 kΩ) with traditional CMOS resistors is often commercially impractical due to die-size and cost restrictions. Therefore, there exists a need for a CMOS resistor having a significantly higher resistance per square than existing CMOS resistors. Furthermore, the process for manufacturing such a CMOS resistor should not require any additional masking steps.

SUMMARY OF THE INVENTION

The present invention provides a process of fabricating a high resistance CMOS resistor with a relatively small die-size. Such a CMOS component can reduce the cost and the die-size of existing circuits to fabricate many novel CMOS circuit designs.

While current CMOS resistors generally do not exceed 1 kΩ–5 kΩ per square, the present invention presents a process of fabricating the high resistance CMOS resistor having a resistance of 10 k–20 kΩ per square. Furthermore, unlike many existing processes of fabricating CMOS resistors, the process according to the present invention does not require any additional masking steps.

According to an embodiment of the present invention, the process of fabricating a high resistance CMOS resistor comprises the following steps: An n-well and a p-well are formed in a p-type silicon substrate. Next, a nitride layer is then deposited over the p-type silicon substrate. Next, photolithography and etching steps are used to pattern the nitride layer to form a patterned mask layer for defining a non-active area and active area over the p-type silicon substrate. In general, some p-type ions are implanted into the non-active area of the p-well. Some channel-stops are also implanted for increasing the isolation capability.

To form a CMOS resistor, the CMOS process according to the present invention includes injecting the same p-type ions into the n-well to form a p-field region. After that, a field oxide is formed on the CMOS resistor. Heavily doped p-type contact regions are formed as the ohmic contacts of the CMOS resistor, after the photolithography, etching, and implanting steps. Finally, two contact openings and two metal contact plugs are formed to electrically connect two ohmic contacts of the CMOS resistor. Thus, a high resistance resistor is formed without requiring any additional masking steps. In addition, this process is fully compatible with standard CMOS processes.

The CMOS resistor according to the present invention substantially reduces the standby power consumption of voltage dividers that are widely used for generating reference voltages. A CMOS resistor having a resistance of 10 kΩ–20 kΩ per square could also substantially reduce the manufacturing and operating costs of many other existing circuits. A higher resistance per square could also make many new analog circuit designs involving high-resistance resistors possible.

However, the scope of this invention is no way limited to the field of low standby-power electronics, or to voltage dividers. There are many other types of circuits that could potentially benefit from the use of such high-resistance CMOS resistors. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
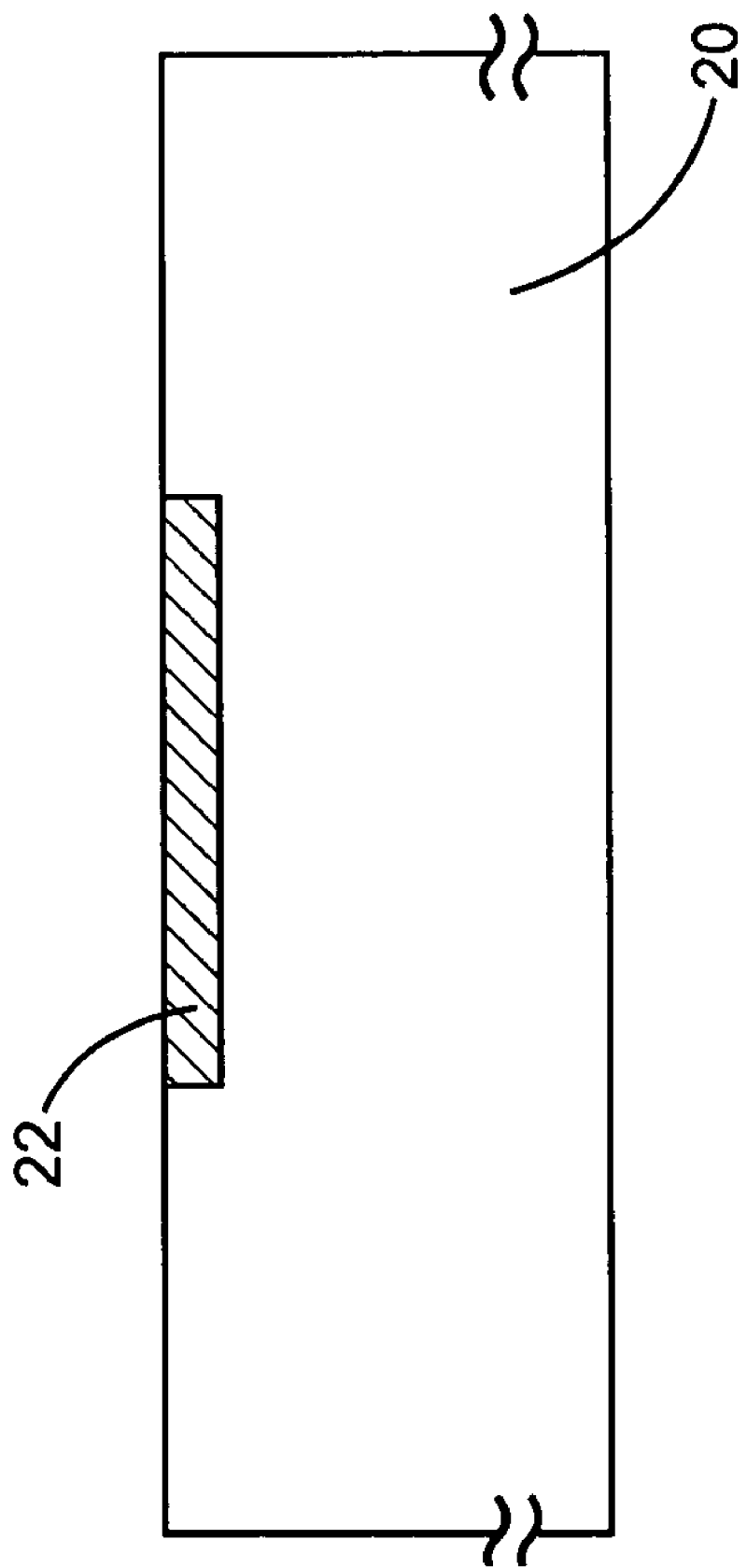
FIG. 1 is a cross-sectional view illustrating a step of forming an n-well in a p-type silicon substrate according to an embodiment of the present invention.

Referring now to the drawings wherein the contents are for purposes of illustrating the preferred embodiment of the invention only and not for purposes of limiting the same. Referring to FIG. 1, phosphorus ions are implanted in a p-type silicon substrate 20 to form an n-well 22. The p-type silicon substrate 20 is doped with boron ions to achieve a resistance of 8Ω–12Ω per cm. The n-well 22 can be formed via well-known photolithography, etching and implantation process as follows. A photoresist layer is formed over the p-type silicon substrate 20. Next, the photoresist layer is exposed using a mask to expose predetermined portions of the photoresist layers. Next, the exposed photoresist is etched to remove the predetermined portions of the p-type silicon substrate 20. Next, an ion implementation is then carried out using an energy level of 100 KeV using phosphorus ions with a dosage level ranging from $6 \times 10^{12}$ to $9 \times 10^{12}$ ions/cm$^2$.

Figure 2:
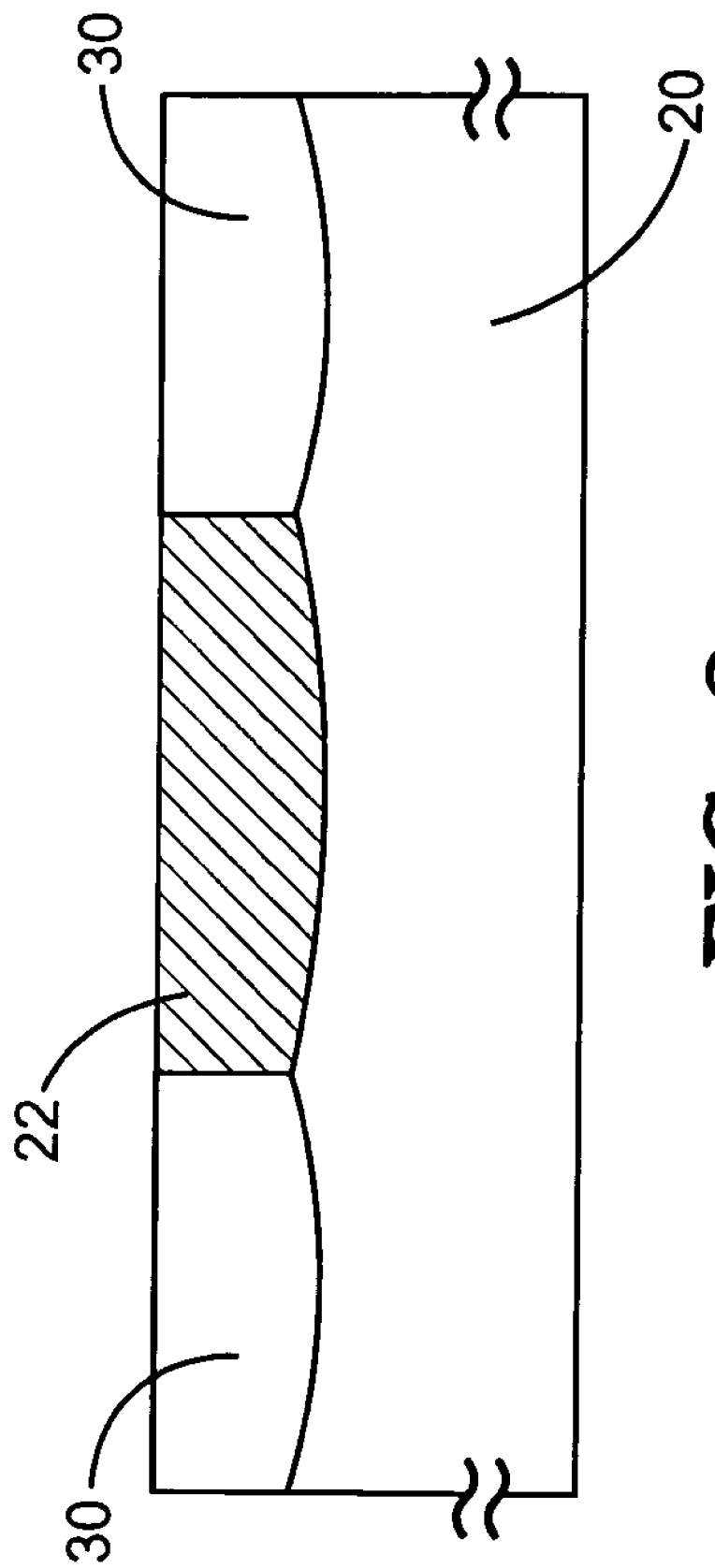
FIG. 2 is a cross-sectional view illustrating a step of forming a p-well and the n-well in the p-type silicon substrate according to an embodiment of the present invention.

Next, as FIG. 2 shows, boron ions are implanted into the p-type silicon substrate 20 to form a p-well 30. The implantation is done using an energy level of 40 KeV, with a dosage level ranging from $8 \times 10^{12}$ to $9 \times 10^{12}$ ions/cm$^2$. Next, a thermal annealing process is carried at, for example, a temperature of about 1150° C., to diffuse the n-type and p-type ions into the respective regions within the p-type silicon substrate 20.

Figure 3:
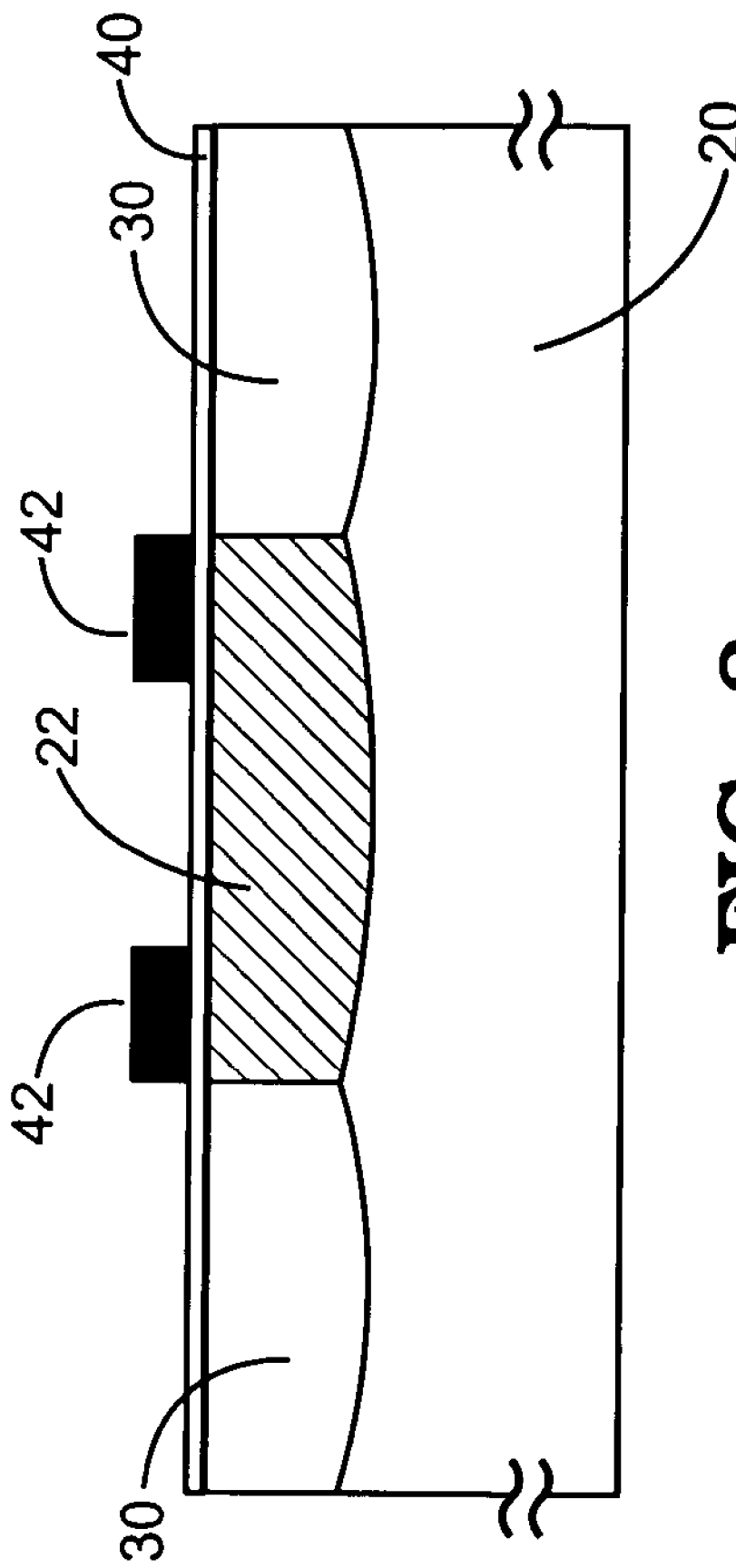
FIG. 3 is a cross-sectional view illustrating a step of forming an active area in the p-type silicon substrate according to an embodiment of the present invention.

As shown in FIG. 3, a pad oxide layer 40 having a thickness of about 350 angstroms is formed over the surface of the p-type silicon substrate 20. The pad oxide layer 40 is formed, for example but limited to, by performing a thermal oxidation at a temperature of 900° C. Next, a nitride layer having a thickness of 1250 angstroms is then deposited at a temperature of 850° C. over the pad oxide layer 40. Next, the nitride layer is etched via photolithography and etching process to form a patterned mask layer 42 over the surface of the pad oxide layer 40. The patterned mask 42 serves as a mask in the subsequent process.

Figure 4:
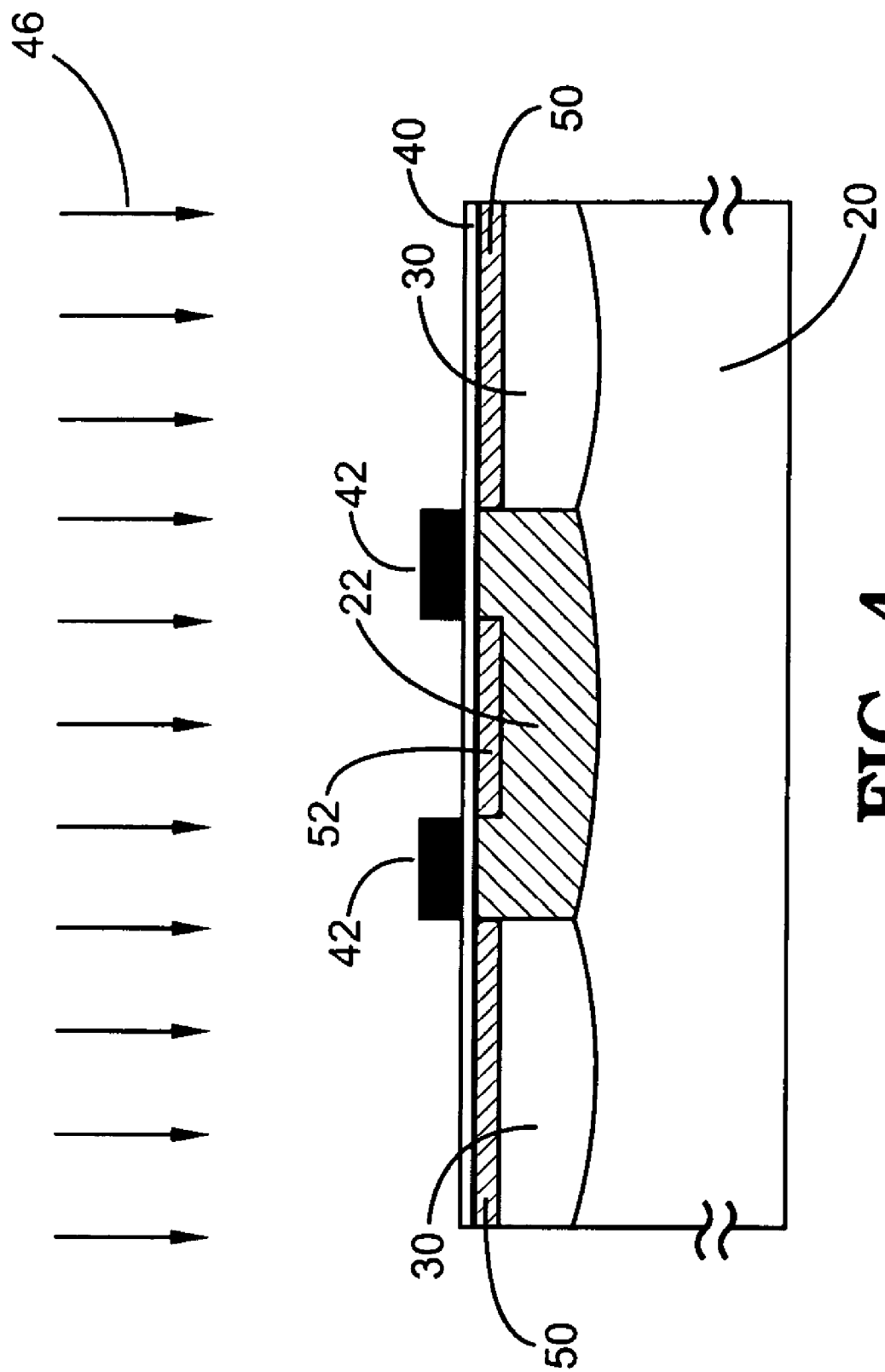
FIG. 4 is a cross-sectional view illustrating a step of forming a p-field area in the n-well and forming another p-field area in the p-well according to an embodiment of the present invention.

Hereinafter, as FIG. 4 shows, performing an ion implantation process 46 using the patterned mask layer 42 as the mask forms a p-field region 50 and a p-field region 52. Boron ions are then implanted at an energy level of 50 KeV with a dosage level ranging from $4 \times 10^{13}$ to $6 \times 10^{13}$ ions/cm$^2$.

Figure 5:
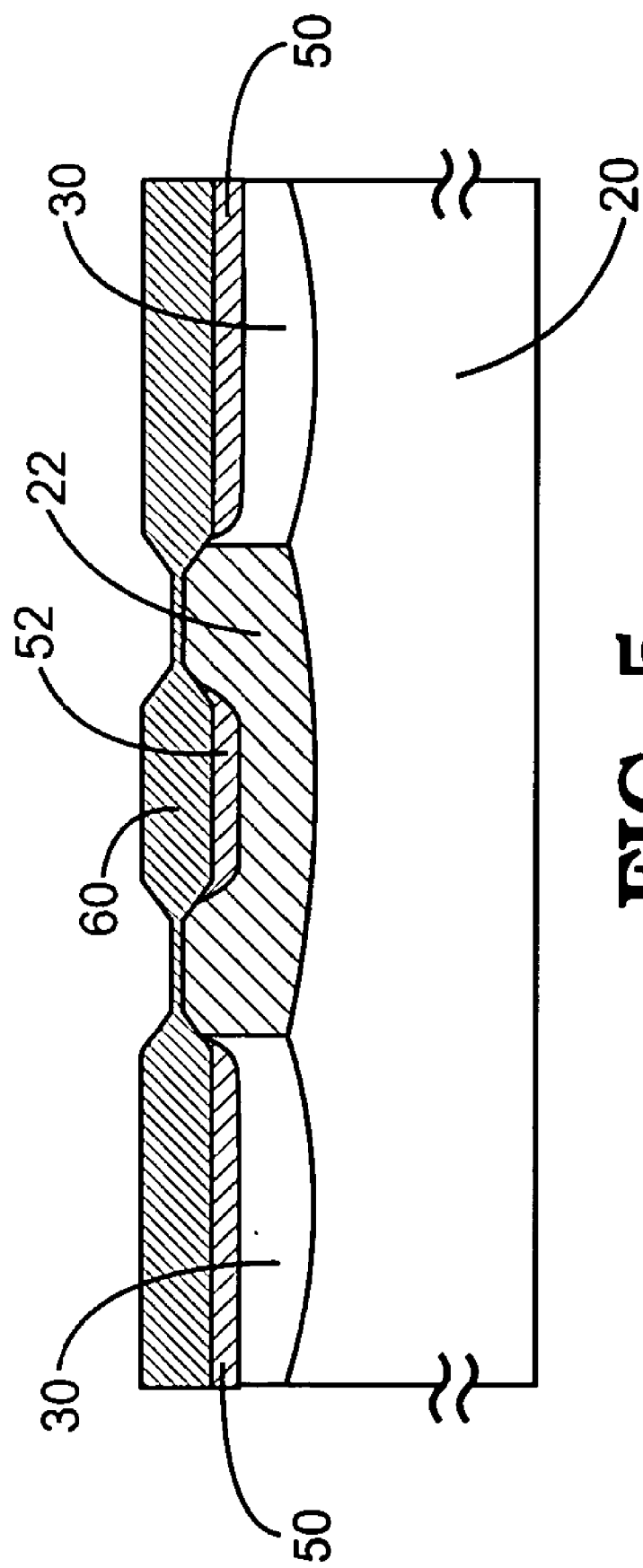
FIG. 5 is a cross-sectional view illustrating a step of performing a field oxidation process according to an embodiment of the present invention.

As shown in FIG. 4, the p-field region 50 and the p-field region 52 are formed below the pad oxide layer 40. As it will be well known to those skilled in the art that the p-field implantation is a standard CMOS process. In general, the p-field region 50 is implanted into the p-well 30. The p-field region 50 acts as device isolation layers (ie, channel stops). However, it should be understood that the p-field implantation could also be done in an unconventional manner. The p-field region 52 is implanted into the n-well 22 in order to form a window into the n-well 22. The p-field region 52 forms a CMOS resistor. This step enables the CMOS resistor, according to the present invention, to be built without the use of any additional masking steps. A field oxidation process is performed at a temperature of 980° C. to form a field oxide layer 60 over the p-type silicon substrate 20 as shown in FIG. 5. The field oxide layer 60 is grown to a thickness of about 5000–6000 angstroms. When this step is completed, the patterned mask layer 42 will be removed.

Figure 6:
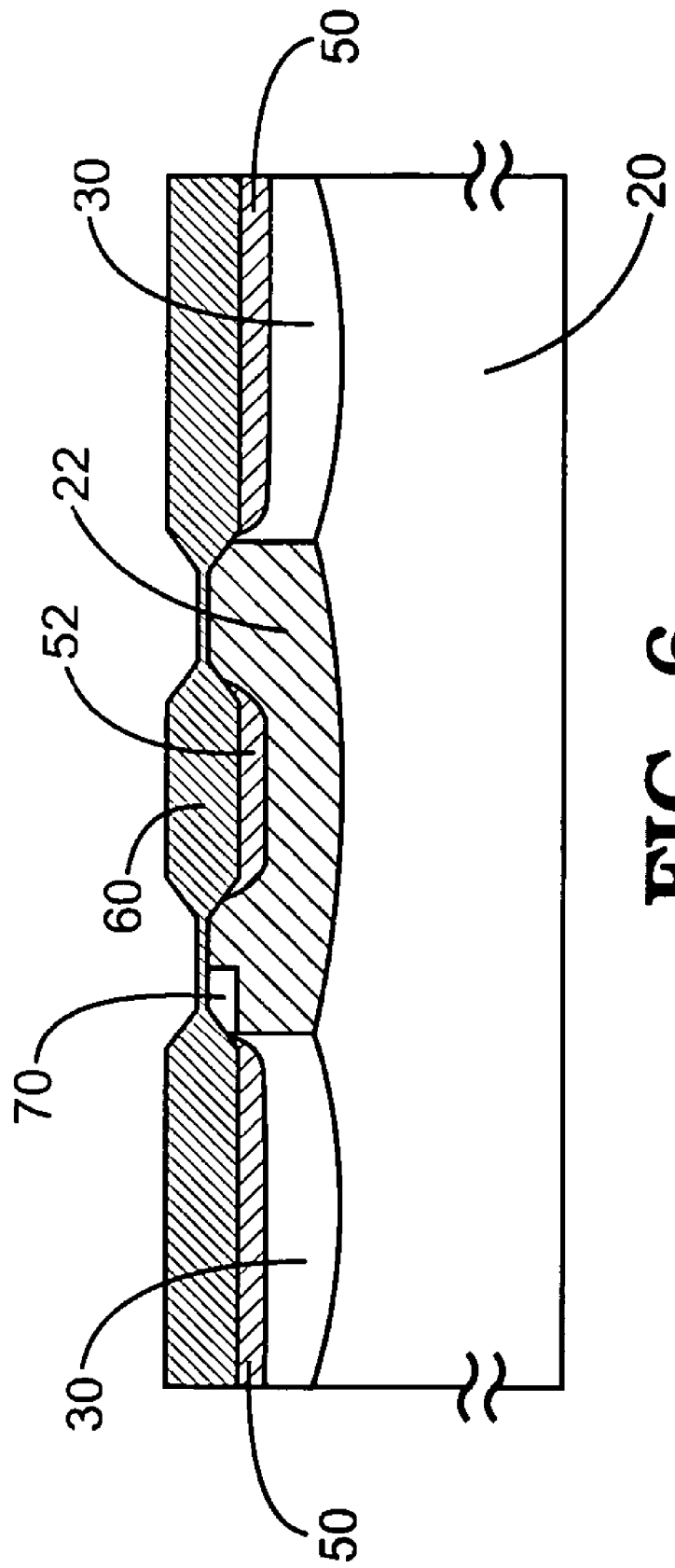
FIG. 6 is a cross-sectional view illustrating a step of forming an n-type contact region according to an embodiment of the present invention.

Now turning to FIG. 6, an n-type contact region 70 is formed in the n-well 22. For example, the n-type contact region 70 can be formed via a conventional photolithography and etching process to form a patterned mask layer exposing predetermined portion of the n-well 22. Arsenic ions are implanted at an energy level of 80 KeV, with a dosage level in a range of $4 \times 20^{15}$ to $6 \times 10^{15}$ ions/cm$^2$. The implantation is done with heavier arsenic atoms because this forms the n-type contact region 70 with a shallow depth. This forms a window for the field oxide layer 60.

Figure 7:
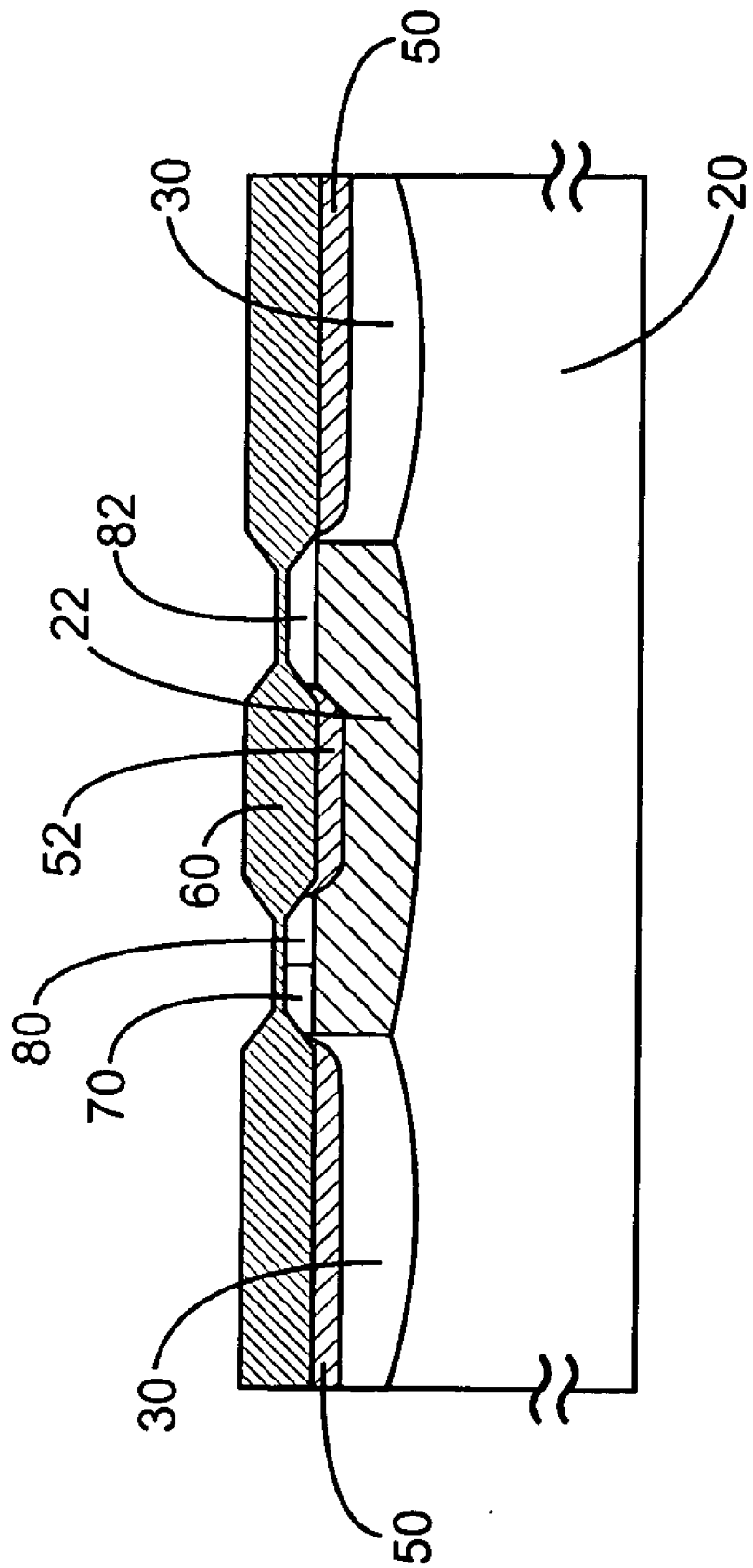
FIG. 7 is a cross-sectional view illustrating a step of forming two p-type contact regions according to an embodiment of the present invention.

As shown in FIG. 7, after forming the n-type contact region 70, p-type contact regions 80 and 82 are formed in the n-well 22. Similarly, the p-type contact region 80 and p-type contact region 82 can also be formed by performing conventional photolithography and etching process to form a patterned mask layer, and then using the patterned mask layer as mask. Boron ions are implanted at an energy level of 25 KeV with a dosage level ranging from $2 \times 10^{15}$ to $4 \times 10^{15}$ ions/cm$^2$.

FIG. 7 shows a cross-sectional view of the p-type contact region 82 implanted in the n-well 22. Therefore, the p-type contact region 80 and the p-type contact region 82 are formed in the n-well 22. The p-type contact regions 80 and 82 act as two ohmic contacts of the CMOS resistor. And this completes the fabrication of a high resistance CMOS resistor.

Figure 8:
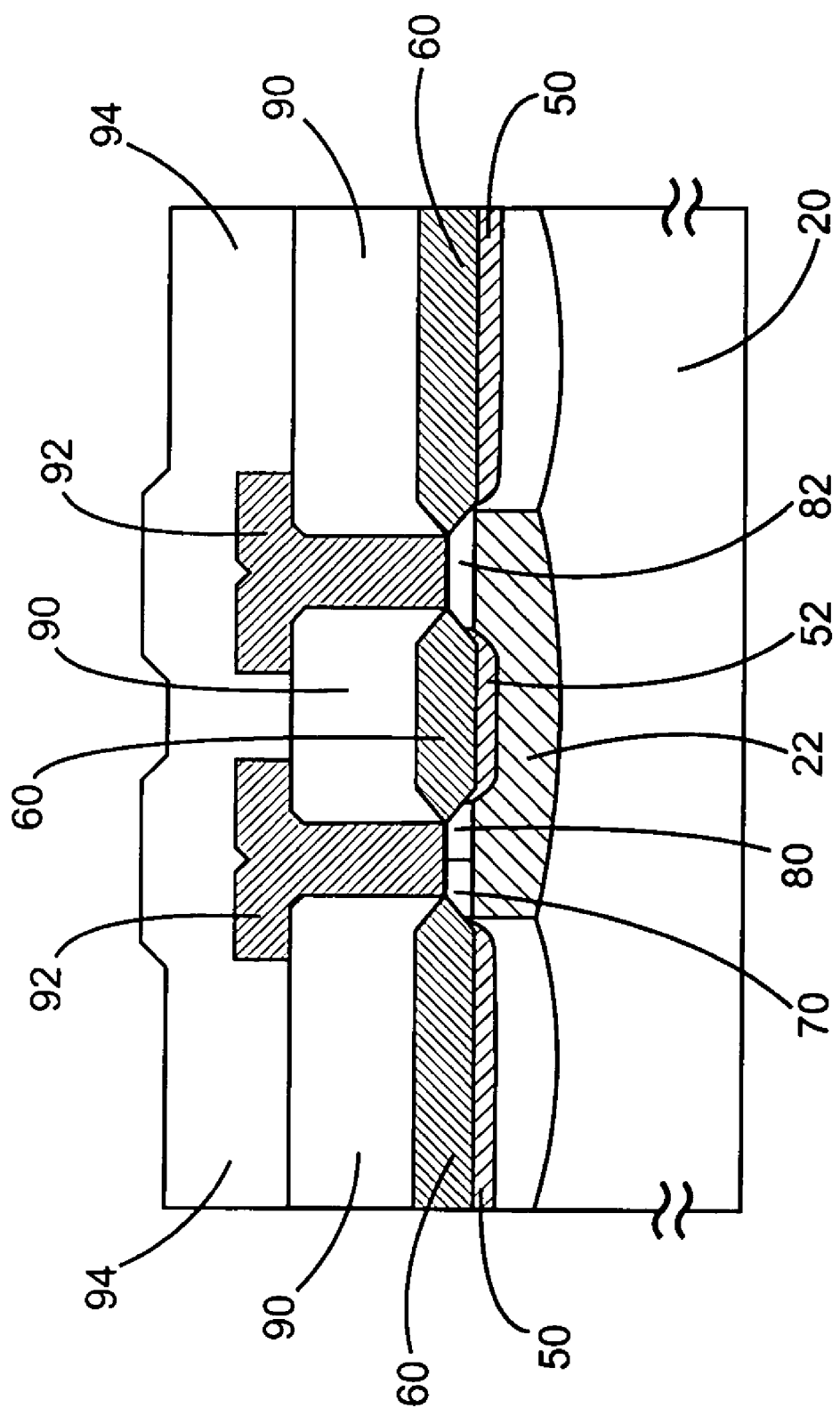
FIG. 8 is a cross-sectional view illustrating steps of forming two metal contact plugs, and a passivation layer according to an embodiment of the present invention.

Next, contact openings and metal contact plugs are formed to electrically contact the two ohmic contacts of the CMOS resistor. As shown in FIG. 8, a BPSG layer 90 is deposited to form two contact openings. For example, the thickness of the BPSG layer 90 is in the range of 5,000 to 8,000 angstroms. Subsequently, a metal layer 92 having a thickness of 5,000 angstroms is sputtered over the BPSG layer 90. For example, the metal layer 92 is an AlSiCu layer. Finally, an oxide layer 94 having a thickness in the range of 5,000 to 10,000 angstroms is deposited over the resulting structure. The oxide layer 94 serves as a passivation layer to protect the CMOS resistor.

Thus, a CMOS resistor having high resistance is formed without any additional masking steps. In addition, this process is fully compatible with standard CMOS processes. This CMOS resistor will have a resistance of about 10 kΩ–20 kΩ per square.

It is to be understood that this process of fabricating a CMOS resistor according to the present invention is described for the purpose of illustrating rather than limiting the scope of the present invention.

Thus, it will be apparent to those skilled in the art, that the method for manufacturing a CMOS resistor according to the present invention could also be applied to manufacture an n-field resistor in an n-type silicon substrate, without departing from the spirit or the scope of the invention.

In view of the foregoing, it is intended that the present invention cover modifications and variations of this invention provided they fall within the scope of the following claims or their equivalents.

What is claimed is:

1. A process of fabricating a high resistance CMOS resistor, comprising the steps of:
   providing a p-type silicon substrate;
   forming an n-well in said p-type silicon substrate;
   forming a p-well in a non-active area of said p-type silicon substrate;
   forming a pad oxide layer on the surface of said p-type silicon substrate;
   forming a first p-field region into said p-well and a second p-field region into said n-well, wherein said second p-field region forms a CMOS resistor;
   forming a field oxide layer over said CMOS resistor;
   forming an n-type contact region in said n-well;

forming two p-type contact regions respectively as a first ohmic contact and a second ohmic contact of said CMOS resistor respectively;

forming a patterned BPSG layer to build two contact openings exposing a portion of said n-type contact region and said two p-type contact regions;

forming two metal contact plugs in said contact openings to electrically connect to said first ohmic contact and said second ohmic contact of said CMOS resistor, and depositing a passivation layer over said contact plugs covering said CMOS resistor.

2. The method of claim 1, wherein said p-type silicon substrate is doped with boron ions, and has a resistance in a range of 8Ω to 12Ω per cm.

3. The method of claim 1, wherein said n-well is formed by implanting phosphorus ions using an energy level of 100 KeV, and with a dosage level in a range of $6\times10^{12}$ to $9\times10^{12}$ ions/cm$^2$.

4. The method of claim 1, wherein said p-well is formed by implanting boron ions using an energy level of 40 KeV, and with a dosage level in a range of $8\times10^{12}$ to $9\times10^{12}$ ions/cm$^2$.

5. The method of claim 1, further comprising a step of performing a thermal annealing process at a temperature of 1150° C. for diffusing ions of said n-well and said p-well into respective regions in said p-type silicon substrate.

6. The method of claim 1, wherein said pad oxide is grown to a thickness of 350 angstroms at a temperature of 900° C.

7. The method of claim 1, further comprising a step of growing a nitride layer to a thickness of 1250 angstroms at a temperature of 850° C. and etching said nitride layer to form a patterned mask layer which serves as a mask for forming said first p-field region and said second p-field region.

8. The method of claim 1, wherein said first p-field region and said second p-field region are formed by implanting boron ions using an energy level of 50 KeV, and with a dosage level in a range of $4\times10^{13}$ to $6\times10^{13}$ ions/cm$^2$.

9. The method of claim 1, wherein said field oxide layer is grown to a thickness of 5000 to 6000 angstroms by performing a thermal annealing process at a temperature of 980° C.

10. The method of claim 1, wherein said n-type contact region is formed by implanting arsenic using an energy level of 80 KeV, and with a dosage level of $4\times10^{15}$ to $6\times10^{15}$ ions/cm$^2$.

11. The method of claim 1, wherein said two p-type contact regions are formed by implanting boron ions using an energy level of 25 KeV, and with a dosage level of $2\times10^{15}$ to $4\times10^{15}$ ions/cm$^2$.

12. The method of claim 1, wherein said metal contact plugs comprises AlSiCu.

13. The method of claim 1, wherein said BPSG layer has a thickness in a range of 5000 to 8000 angstroms.

14. The method of claim 1, wherein said passivation layer is an oxide layer having a thickness in a range of 5000 to 10000 angstroms.

15. The method of claim 1, wherein said CMOS resistor has at least a resistance of 10 kΩ per square.

16. The method of claim 1, wherein said CMOS resistor is compatible with a standard CMOS process.

17. A process of fabricating a high resistance CMOS resistor, comprising the steps of:

providing a p-type silicon substrate;

forming an n-well in the p-type silicon substrate;

forming a p-well in a non-active area of said p-type silicon substrate;

forming a pad oxide layer on the surface of said p-type silicon substrate;

forming a first p-field region into said p-well and a second p-field region into said n-well, wherein the second p-field region forms a CMOS resistor;

forming a field oxide layer over the CMOS resistor;

forming an n-type contact region in said n-well; and forming two p-type contact regions respectively as a first ohmic contact and a second ohmic contact of the CMOS resistor respectively.

18. The step according to claim 17, further comprising:

forming a patterned BPSG layer as an intermetal dielectric layer to build two contact openings exposing a portion of said n-type contact region and said two p-type contact regions.

19. The step according to claim 18, further comprising:

forming two metal contact plugs in said contact openings to electrically connect to said first ohmic contact and said second ohmic contact of said CMOS resistor.

20. The step according to claim 19, further comprising:

depositing a passivation layer over said contact plugs covering said CMOS resistor.

21. The step according to claim 17, wherein said CMOS resistor has at least a resistance of 10 kΩ per square.

22. The step according to claim 17, wherein said process is compatible with a standard CMOS process.

* * * * *